United States Patent
Ando et al.

(10) Patent No.: US 10,686,076 B2
(45) Date of Patent: Jun. 16, 2020

(54) GERMANIUM CONDENSATION FOR REPLACEMENT METAL GATE DEVICES WITH SILICON GERMANIUM CHANNEL

(71) Applicant: International Business Machines Corporation, Armonk, NY (US)

(72) Inventors: Takashi Ando, Tuckahoe, NY (US); Pouya Hashemi, White Plains, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/207,564

(22) Filed: Dec. 3, 2018

(65) Prior Publication Data

US 2019/0198657 A1   Jun. 27, 2019

Related U.S. Application Data

(62) Division of application No. 15/660,192, filed on Jul. 26, 2017, now Pat. No. 10,147,820.

(51) Int. Cl.
*H01L 29/78* (2006.01)
*H01L 29/66* (2006.01)
(Continued)

(52) U.S. Cl.
CPC ...... *H01L 29/785* (2013.01); *H01L 21/28255* (2013.01); *H01L 29/1054* (2013.01);
(Continued)

(58) Field of Classification Search
CPC ............ H01L 29/785; H01L 29/66545; H01L 29/66795; H01L 29/165
See application file for complete search history.

(56) References Cited

U.S. PATENT DOCUMENTS

| 7,659,156 B2 | 2/2010 | Thean et al. |
| 7,687,356 B2 | 3/2010 | Coronel et al. |

(Continued)

OTHER PUBLICATIONS

Jiang, Y., et al., "Ge-Rich (70%) SiGe Nanowire MOSFET Fabricated Using Pattern-Dependent Ge-Condensation Technique", IEEE Electron Device Letters, Jun. 2008, pp. 1-4, vol. 29, No. 6.
(Continued)

*Primary Examiner* — Victor A Mandala
(74) *Attorney, Agent, or Firm* — Fleit Intellectual Property Law; Thomas S. Grzesik

(57) ABSTRACT

A semiconductor structure and a method for fabricating the same. The structure includes a substrate and at least one semiconductor fin. The semiconductor structure further includes a channel region within the semiconductor fin. The channel region includes a higher content of germanium than remaining portions of the semiconductor fin. The semiconductor structure also includes a gate stack in contact with the semiconductor fin. The method includes removing a dummy gate formed on at least one semiconductor fin. The removal of the dummy gate exposes a channel region of the semiconductor fin. A germanium dioxide layer is formed in contact with the channel region. A condensation process is performed after the germanium dioxide layer has been formed. The condensation process increases germanium content only in the channel region.

20 Claims, 10 Drawing Sheets

(51) Int. Cl.
*H01L 29/165* (2006.01)
*H01L 29/161* (2006.01)
*H01L 29/10* (2006.01)
*H01L 21/28* (2006.01)

(52) U.S. Cl.
CPC .......... *H01L 29/161* (2013.01); *H01L 29/165* (2013.01); *H01L 29/66545* (2013.01); *H01L 29/66795* (2013.01)

(56) References Cited

U.S. PATENT DOCUMENTS

| | | |
|---|---|---|
| 8,053,299 B2 | 11/2011 | Xu |
| 8,460,990 B2 | 6/2013 | Kim et al. |
| 9,040,391 B2 | 5/2015 | Damlencourt et al. |
| 9,263,549 B2 | 2/2016 | Rodder et al. |
| 9,368,569 B1* | 6/2016 | Leobandung ..... H01L 29/66795 |
| 9,406,529 B1* | 8/2016 | Chan .................... H01L 29/165 |
| 9,425,318 B1* | 8/2016 | Hoentschel ......... H01L 29/7851 |
| 9,431,538 B2 | 8/2016 | Reboh et al. |
| 9,634,142 B1* | 4/2017 | Schepis ............. H01L 29/66803 |
| 10,147,820 B1 | 12/2018 | Ando et al. |
| 10,510,872 B2* | 12/2019 | Xu ..................... H01L 29/1054 |
| 2015/0311286 A1* | 10/2015 | Lee ..................... H01L 29/1033 257/351 |
| 2016/0293610 A1 | 10/2016 | Chang et al. |
| 2017/0162570 A1* | 6/2017 | Shih .................... H01L 27/0922 |

OTHER PUBLICATIONS

Hashemi, P., et al., "First Demonstration of High-Ge-Content Strained-Si1-xGex (x=0.5) on Insulator PMOS FinFETs with High Hole Mobility and Aggressively Scaled Fin Dimensions and Gate Lengths for High-Performance Applications", Proceedings of the IEEE International Electron Devices Meeting, Dec. 15-17, 2014, pp. 1-4.

Wang, K., et al., "SiGe/Si electronics and optoelectronics", Journal of Vacuum Science & Technology B: Microelectronics and Nanometer Structures Processing, Measurement, and Phenomena, May/Jun. 1993, pp. 1159-1167, vol. 11, No. 3.

People, R., et al., "Calculation of critical layer thickness versus lattice mismatch for GexSi1-x/Si strained-layer heterostructures", Applied Physics Letter, Aug. 1985, pp. 322-324, vol. 47, No. 3.

Kohama, Y., et al., "Determination of the critical layer thickness of Si1-xGex/Si heterostructures by direct observation of misfit dislocations", Applied Physics Letter, Feb. 1998, pp. 380-382, vol. 52, No. 1.

List of IBM Patents or Patent Applications Treated as Related.

* cited by examiner

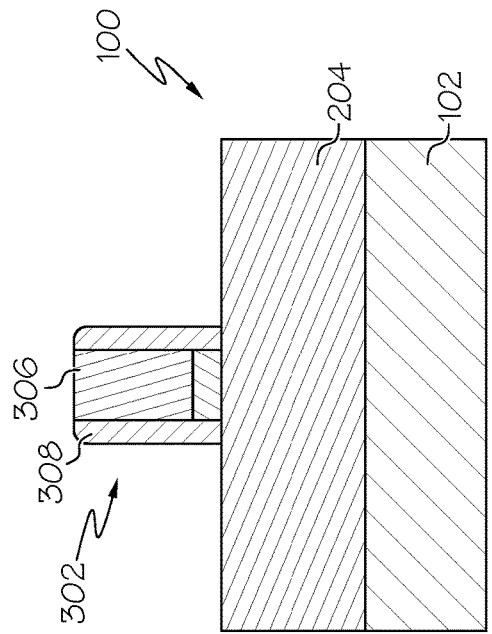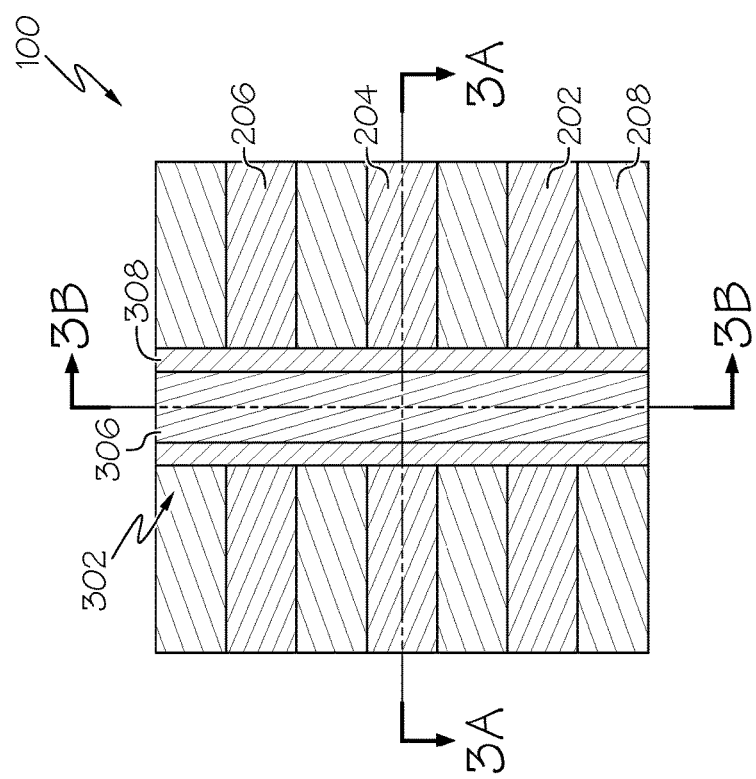
FIG. 3A
FIG. 3B
FIG. 3

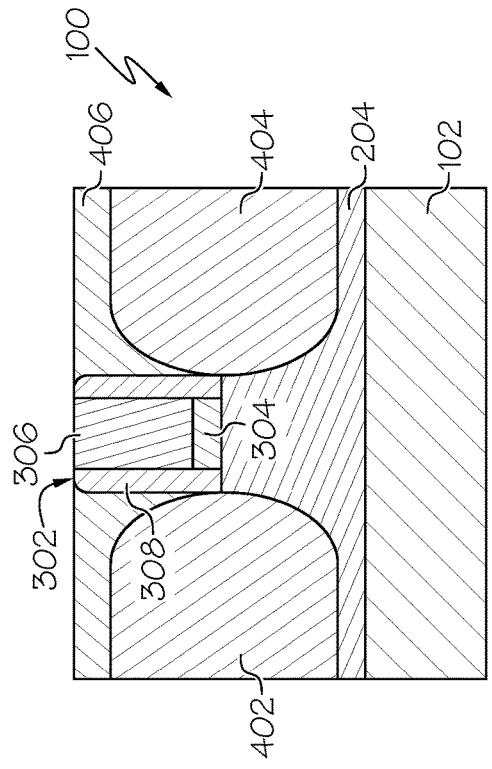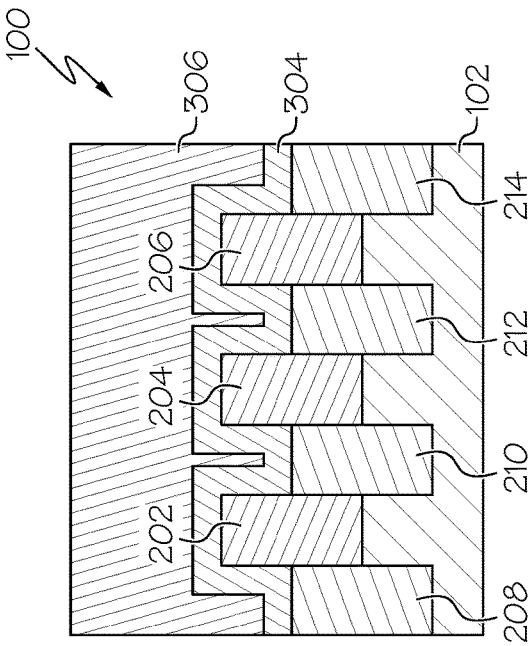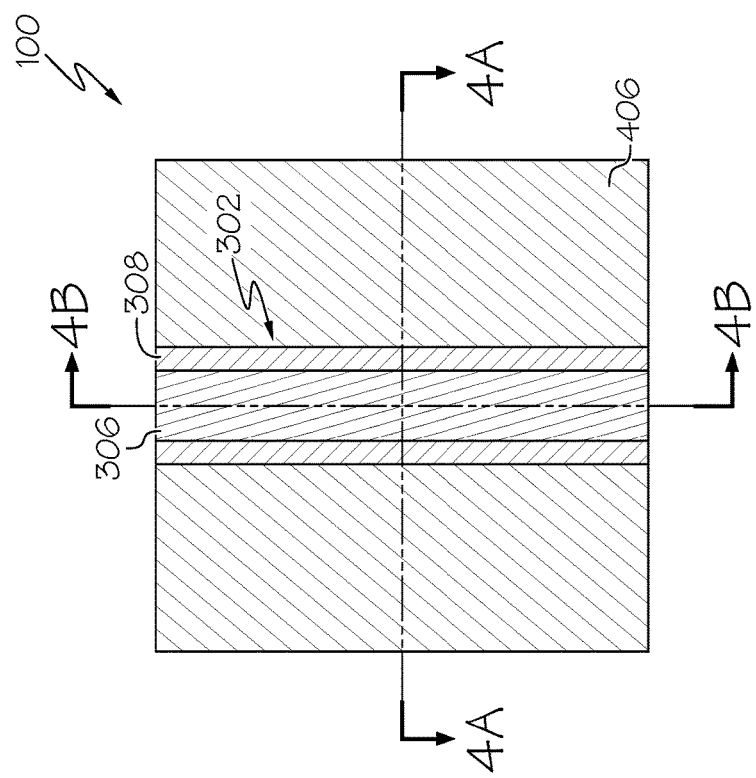
FIG. 4A
FIG. 4B
FIG. 4

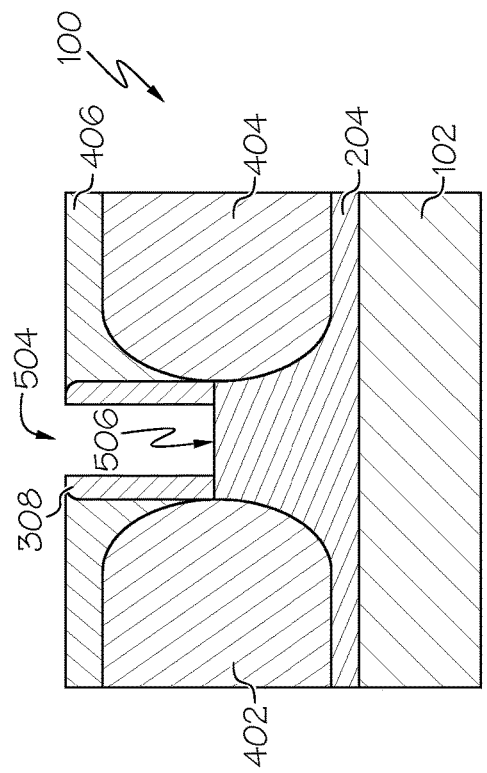
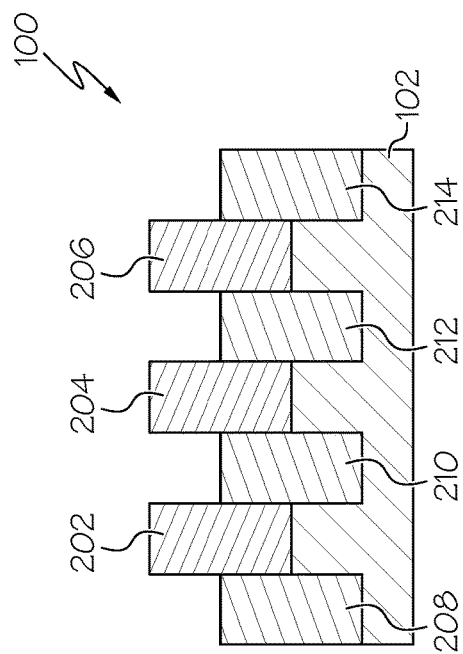
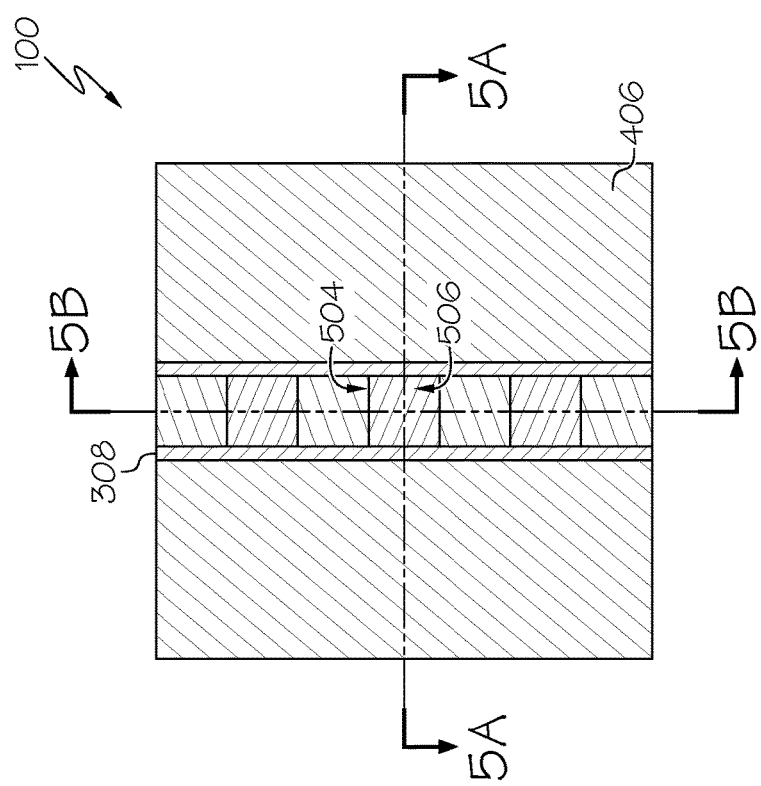

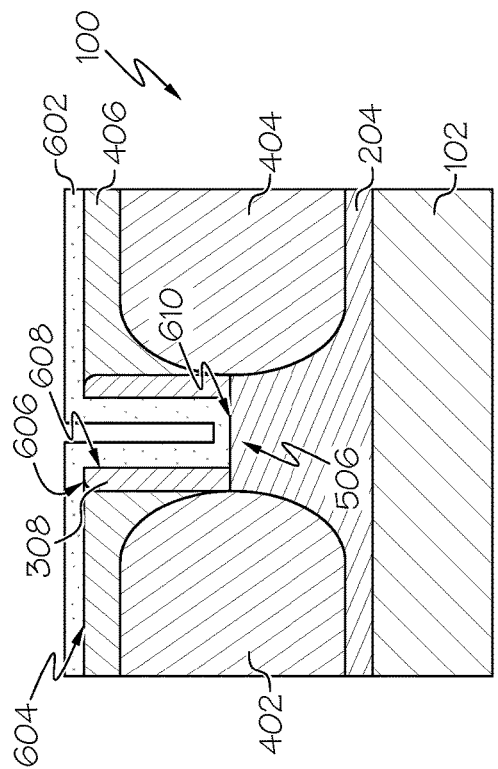
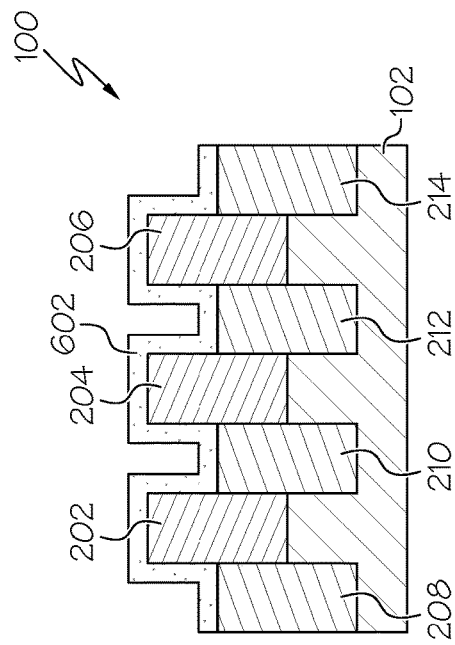
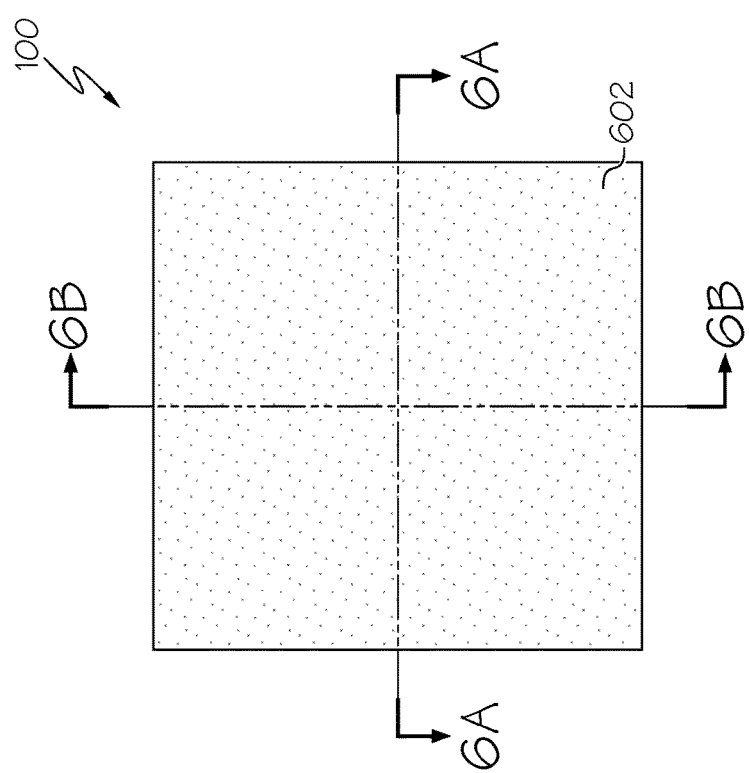

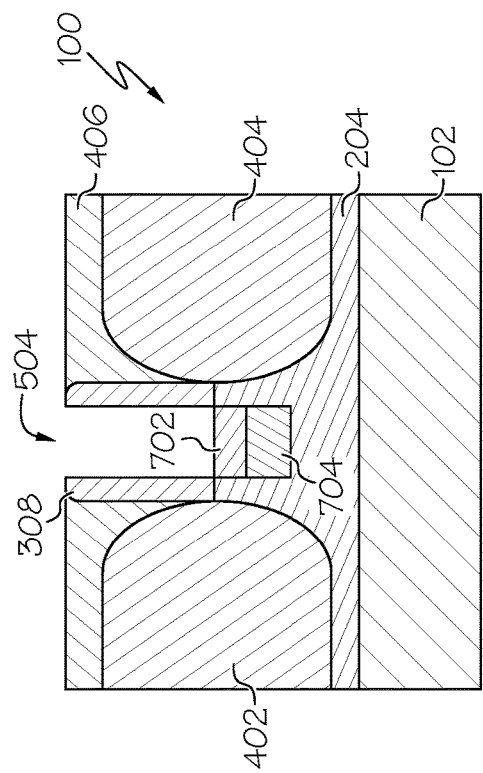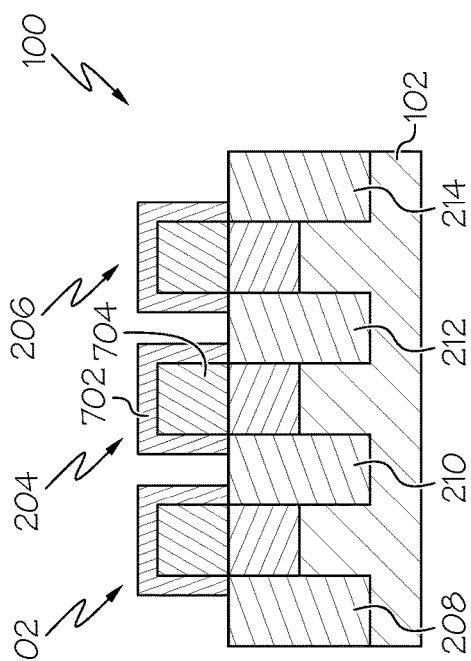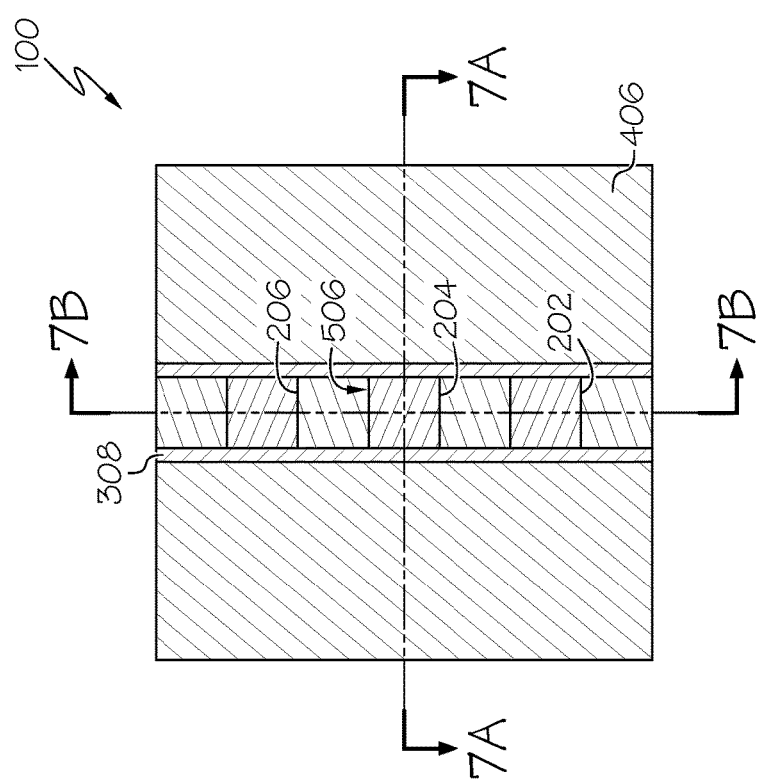

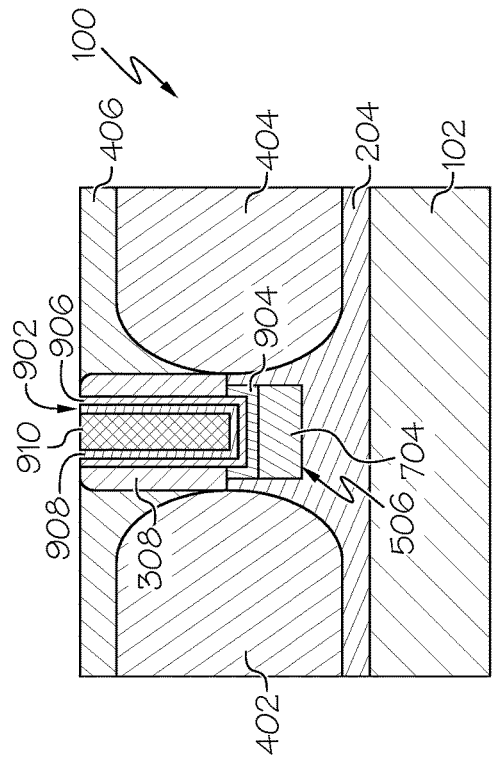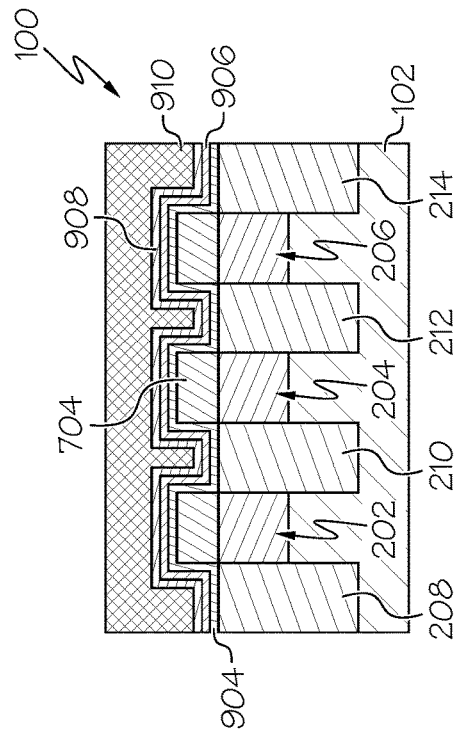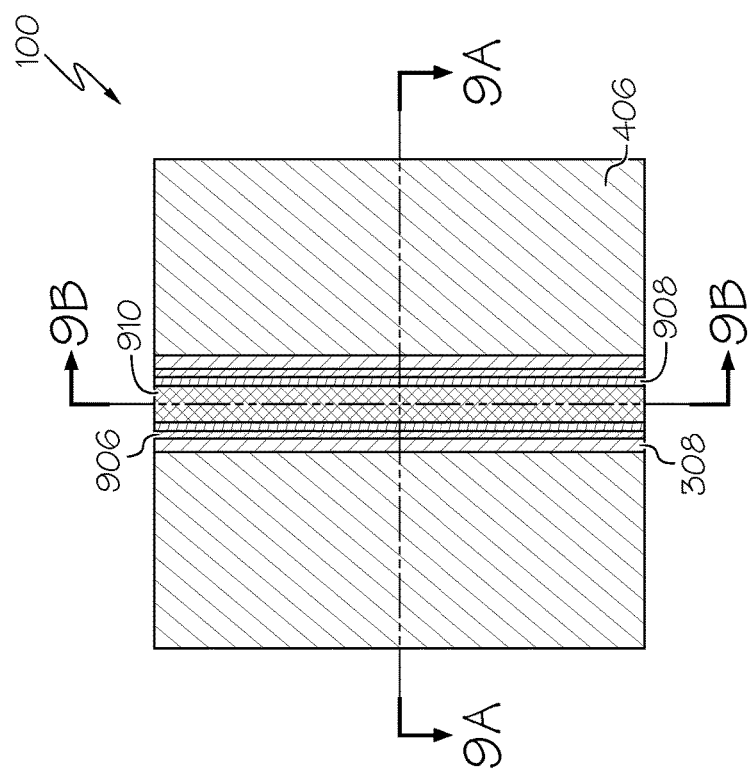

US 10,686,076 B2

GERMANIUM CONDENSATION FOR REPLACEMENT METAL GATE DEVICES WITH SILICON GERMANIUM CHANNEL

BACKGROUND

The present invention generally relates to semiconductor devices, and more particularly relates to semiconductor devices having a silicon germanium channel.

One promising dual channel CMOS integration scheme for future technologies utilizes tensile-strained silicon (Si) for n-type Field Effect Transistors (nFETs) and compressively strained silicon germanium (SiGe) grown on a Si substrate for p-type Field Effect Transistors (pFETs). With respect to pFETs, a strained SiGe channel with a high germanium (Ge) content is usually required for achieving increased device performance and reliability. However, it is difficult to achieve these advantages for pFETs having a strained SiGe channel comprising high germanium (Ge) content using conventional fabrication techniques.

SUMMARY OF THE INVENTION

In one embodiment, a method for forming a semiconductor structure is provided. The method comprises removing a dummy gate formed on at least one semiconductor fin. The removal of the dummy gate exposes a channel region of the semiconductor fin. A germanium dioxide layer is formed in contact with the channel region. A condensation process is performed after the germanium dioxide layer has been formed. The condensation process increases germanium content only in the channel region.

In another embodiment, a semiconductor structure is provided. The semiconductor structure comprises a substrate and at least one semiconductor fin. The semiconductor structure further comprises a channel region within the semiconductor fin. The channel region comprises a higher content of germanium than remaining portions of the semiconductor fin. The semiconductor structure also comprises a gate stack in contact with the semiconductor fin.

In yet another embodiment, an integrated circuit is provided. The integrated circuit comprises a semiconductor structure. The semiconductor structure comprises a substrate and at least one semiconductor fin. The semiconductor structure further comprises a channel region within the semiconductor fin. The channel region comprises a higher content of germanium than remaining portions of the semiconductor fin. The semiconductor structure also comprises a gate stack in contact with the semiconductor fin.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 3 is a top-down view of the semiconductor structure after a dummy gate has been formed on the semiconductor fins according one embodiment of the present invention;

FIGS. 3A and 3B are cross-sectional views of the semiconductor structure after a dummy gate has been formed on the semiconductor fins according one embodiment of the present invention;

FIG. 4 is a top-down view of the semiconductor structure after a source/drain has been formed on the semiconductor structure according one embodiment of the present invention;

FIGS. 4A and 4B are cross-sectional views of the semiconductor structure after a source/drain has been formed on the semiconductor structure according one embodiment of the present invention;

FIG. 5 is a top-down view of the semiconductor structure after the dummy gates has been removed according one embodiment of the present invention;

FIGS. 5A and 5B are cross-sectional views of the semiconductor structure after the dummy gate has been removed according one embodiment of the present invention;

FIG. 6 is a top-down view of the semiconductor structure after a thin layer of germanium dioxide has been deposited according one embodiment of the present invention;

FIGS. 6A and 6B are cross-sectional views of the semiconductor structure after a thin layer of germanium dioxide has been deposited according one embodiment of the present invention;

FIG. 7 is a top-down view of the semiconductor structure after a condensation process has been performed to increase germanium content in the channel region according one embodiment of the present invention;

FIGS. 7A and 7B are cross-sectional views of the semiconductor structure after a condensation process has been performed to increase germanium content in the channel region according one embodiment of the present invention;

FIG. 9 is a top-down view of the semiconductor structure after a replacement gate structure has been formed on the channel region according one embodiment of the present invention;

FIGS. 9A and 9B are cross-sectional views of the semiconductor structure after a replacement gate structure has been formed on the channel region according one embodiment of the present invention.

DETAILED DESCRIPTION

Figure 1:
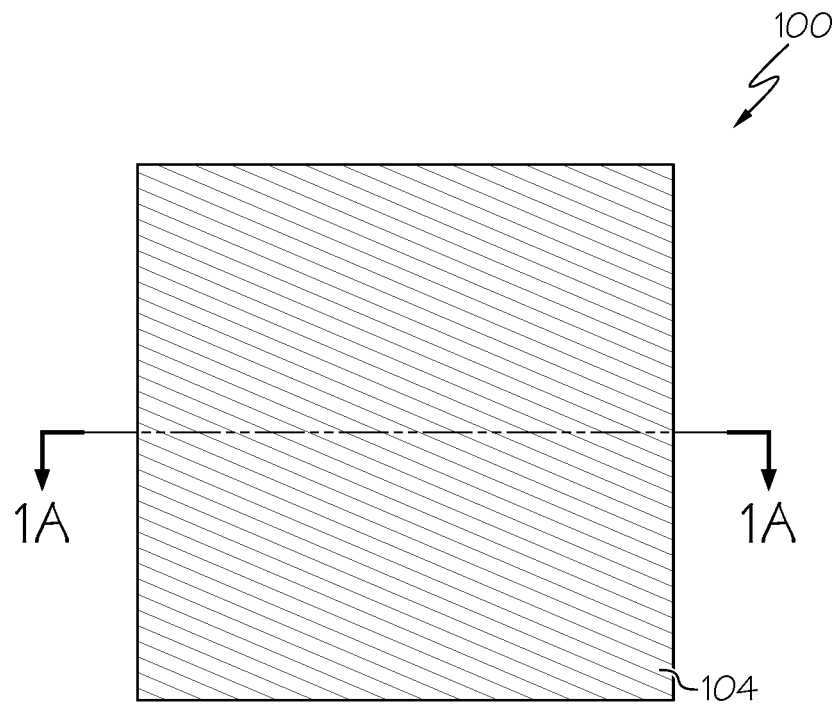
FIG. 1 is a top-down view of an initial semiconductor structure according one embodiment of the present invention.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As noted above, a strained SiGe channel having a high concentration of Ge provides pFETs with high performance and better reliability. However, due to the critical thickness of SiGe epitaxial growth on Si, a high Ge content (e.g., >25%) strained SiGe finFET is difficult to obtain without performing Ge condensation techniques after fin definition. Conventional Ge condensation techniques generally need to be applied prior to forming the gate stack due to a high temperature (e.g., >950° C.) oxidation process. This results in high Ge content but with a narrow bandgap at the extension area causing high off current due to band-to-band tunneling. In addition, the high temperature oxidation process causes up-diffusion of punch through stopping (PTS) implant species such as phosphine into the fin. The up-diffusion introductions additional mobility degradation and device variability. Accordingly, it is difficult to simultaneously achieve high drive currents and low off currents for pFETs having a SiGe channel with high Ge content using conventional Ge condensation techniques.

As will be discussed in greater detail below, embodiments of the present invention overcome the above problems by performing a low temperature Ge condensation after dummy gate removal in a Replacement Metal Gate (RMG) flow. This results in Ge condensation only at the channel portion of the pFET structure, leaving SiGe under the spacer as low as the initial Ge concentration. In addition, the low temperature Ge condensation technique prevents up-diffusion of the punch through stopping implant species.

Referring now to the drawings in which like numerals represent the same or similar elements, FIGS. 1-9 illustrate various processes for fabricating a semiconductor device comprising a high Ge content SiGe channel. In general, the figures comprise a plain view and various cross-sectional views that are taken where indicated in the plain view. More specifically, the view "A" is taken along a line that passes through a fin, while view "B" is a cross-section view that is taken transverse to the long axis of the fins. It should be noted that one or more embodiments are not limited to the processes discussed below for forming the initial fin structures, gate structures, and completing the device(s) the device.

Figure 1A:
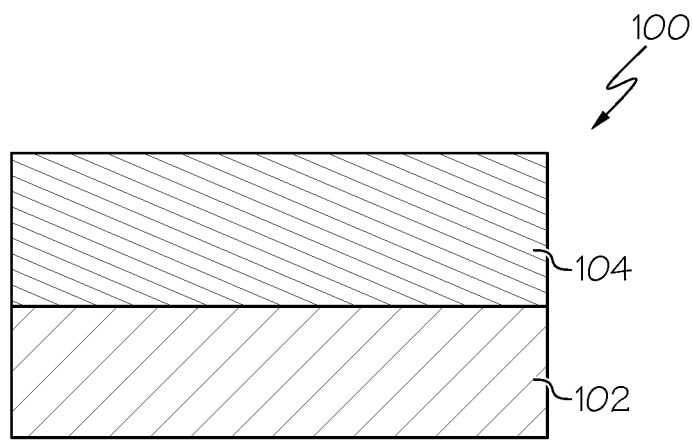
FIG. 1A is a cross-sectional view of the initial semiconductor structure according one embodiment of the present invention.

As shown in FIGS. 1 and 1A, an initial semiconductor structure 100 is illustrated. In one embodiment, the semiconductor structure 100 comprises a base substrate 102 and a SiGe semiconductor layer 104. In other embodiment, the structure 100 comprises a dielectric layer (e.g., a BOX layer or oxide layer) layer between the substrate 102 and the semiconductor layer 104. This configuration is referred to as SiGe-on-insulator (SGOI) substrate, where the dielectric layer isolates the SiGe layer 104 from the base substrate 102.

The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. In one embodiment, the base substrate 102 includes silicon and may include a punch-through-stopper (PTS) comprised of phosphine. In one embodiment, PTS species may be incorporated into a substrate using ion implantation process. Typically the base substrate 104 may be about several hundred microns thick.

The optional dielectric layer (not shown) may be formed from any of several dielectric materials. Non-limiting examples include, for example, oxides, nitrides and oxynitrides of silicon. The dielectric layer 104 may also include oxides, nitrides and oxynitrides of elements other than silicon. In addition, the dielectric layer may include crystalline or non-crystalline dielectric material. Moreover, the dielectric layer may be formed using any of several methods. Non-limiting examples include ion implantation methods, thermal or plasma oxidation or nitridation methods, chemical vapor deposition methods and physical vapor deposition methods. The dielectric layer may include a thickness ranging from about 5 nm to about 200 nm. In one embodiment, the dielectric layer may be about 25 nm thick.

The SiGe layer 104 may be formed using any of several methods known in the art. Non-limiting examples include SIMOX (Separation by IMplantation of OXygen), wafer bonding, and/or epitaxial growth. Typically, the SiGe layer 108 includes a thickness ranging from about 5 nm to about 100 nm. In one embodiment, the SiGe layer 104 may be about 15 nm thick. In addition, the SiGe layer 104 comprises a low percentage of Ge content such as less than 30% Ge and is free from the PTS dopant(s).

Figure 2A:
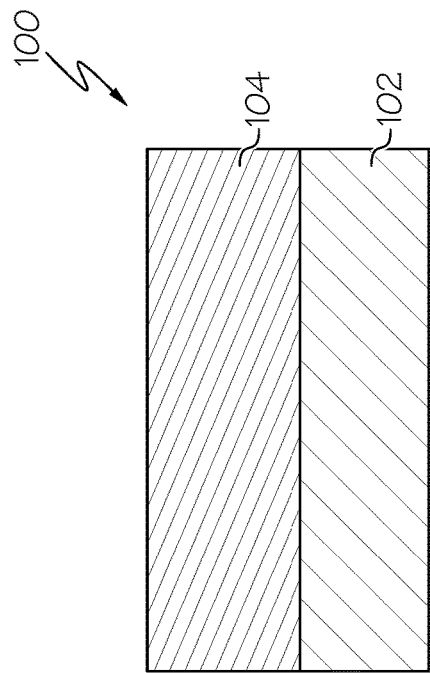
FIGS. 2A and 2B are cross-sectional views of the semiconductor structure after semiconductor fins have been formed according one embodiment of the present invention.
Figure 2B:
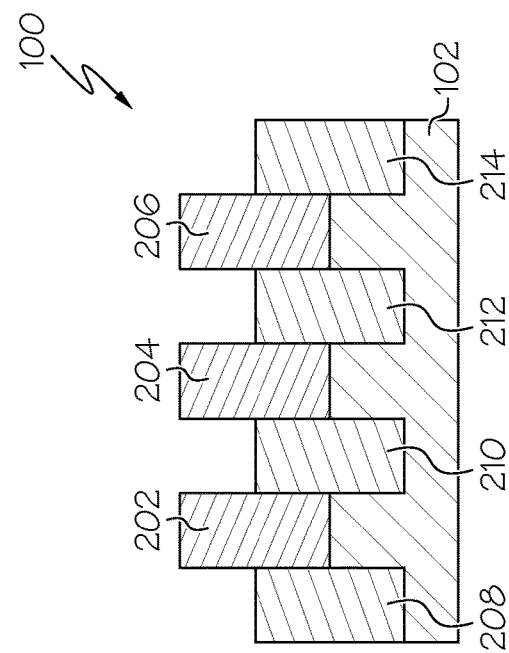
Figure 2:
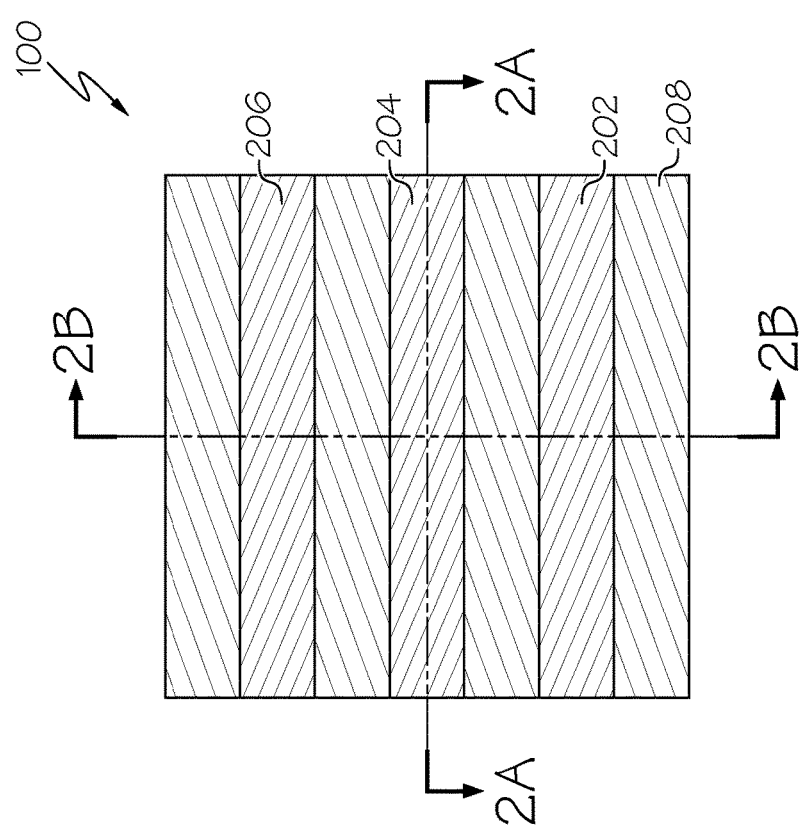
FIG. 2 is a top-down view of the semiconductor structure after semiconductor fins have been formed according one embodiment of the present invention.

The SiGe layer 104 is then patterned to form one or more fins 202, 204, 206 as shown in FIGS. 2 to 2B. It should be noted that embodiments of the present invention are applicable to any number of fins. The fins 202, 204, 206 are formed, in one embodiment, by forming an etch-stop capping layer onto the SiGe layer 104 through, for example, deposition. The etch-stop capping layer, in one embodiment, may be made of silicon-nitride although other material suitable in providing etch-stop function may be used as well. One or more fin structures 202, 204, 206 are subsequently formed or etched out of the SiGe layer 106 to be on top of substrate 102 (or the optional dielectric layer if formed) through a process involving masking, using industry-standard lithographic techniques, and directionally etching the etch-stop capping layer and underneath semiconductor layer. The directional etching process, for example a reactive-ion-etching (ME) process, stops on the substrate 102 (or dielectric layer if formed). After the ME etching process, the photo-resist mask used in the lithographic etching process may be removed, leaving the fin structure 202, 204, 206. After forming multiple fins, isolation regions 208 to 214 are formed between the fin structures 202, 204, 206. In one embodiment, a portion of the substrate 102 is recessed below a bottom surface of the fins and filled with an insulating film (e.g. $SiO_2$) to form the isolation regions 208 to 214 for device isolation. These structures are may obtained by depositing the insulating film, followed by a recess process using RIE or wet etching. In one embodiment, the top surface of the isolation regions 208 to 214 extends above the bottom surface of the fins 202, 204, 206.

FIGS. 3 to 3B show that a dummy gate stack(s) 302 is formed on the fin structures 202, 204, 206. The dummy gate stack 302 is formed, in one embodiment, using oxide, polysilicon, amorphous silicon, nitride, or a combination thereof. In one example, the dummy gate stack(s) 302 comprises an oxide layer 304 formed on and in contact with the fin structures 202, 204, 206, and further comprises an amorphous silicon layer 306 formed on and in contact with the oxide layer 304. The dummy gate stack(s) 302 is to be replaced later by a high-k (HK) and metal gate (MG) after the Ge condensation process discussed below. The dummy gate stack(s) 302 may formed by any suitable process or processes. For example, the gate stack(s) 302 may be formed by a procedure including deposition, photolithography patterning, and etching processes.

A spacer(s) 308 may then be formed on the sidewalls of the dummy gate stack(s) 302 by one or more spacer formation techniques. For example, the spacer(s) 308 may be formed by isotropically depositing a conformal layer of insulating material (e.g., silicon oxide, silicon nitride, silicon oxynitride, and high-k dielectric material and the like) followed by an anisotropic etch (e.g., reactive ion etch (RIE)) of that material to form a spacer(s). An optional hard mask (not shown) can be formed on top of the dummy gate stack(s) 202. The hard mask can comprise a dielectric material such as a nitride, oxide, oxynitride material, and/or any other suitable dielectric layer. The dielectric hard mask can be a single layer of dielectric material or multiple layers of dielectric materials, and can be formed by a deposition process such as chemical vapor deposition (CVD) and/or atomic layer deposition (ALD). Alternatively, the hard mask can be grown, such as through thermal oxidation or thermal nitridation.

After the dummy gate stack(s) 302 has been formed, source/drain features 402, 404 are formed on the structure 100, as shown in FIGS. 4 to 4B. In one embodiment, the source/drain features 402, 404 may be formed by epitaxially growing a semiconductor material layer on exposed portions of the SiGe layer 106 adjacent to the spacers. The terms "epitaxially growing", "epitaxial growth", "epitaxially grown", and their variants mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatus that are suitable for use in one or more embodiments include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). A number of different sources can be used for the deposition of the various layers discussed herein. For example, the gas source for the deposition of epitaxial semiconductor material can include a silicon containing gas source, a germanium containing gas source, a carbon containing gas source, or a combination thereof. Examples of silicon containing gas sources are silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane, and combinations thereof. Examples of germanium containing gas sources are germane, digermane, halogermane, dichlorogermane, trichlorogermane, tetrachlorogermane and combinations thereof. While an epitaxial silicon germanium alloy fin can be formed utilizing a combination of such gas sources. Carrier gases like hydrogen, nitrogen, helium and argon can be used.

In one embodiment, the semiconductor material layer of the source/drains 402, 404 are formed from in-situ boron doped (ISBD) silicon germanium (SiGe). Namely, boron is introduced during growth of a SiGe epitaxial material in the source and drain regions of the PFET device. In other embodiments, the source/drain features 402, 404 are not in-situ doped and implantation process (i.e., a junction implant process) is performed to dope the source/drain.

After the epitaxial source/drain formation, an inter-layer dielectric (ILD) layer 406 is deposited and followed by chemical mechanical planarization (CMP) process. The CMP process stops at the cap (not shown) of the dummy gate(s) 202. The ILD layer may comprise silicon oxide, oxynitride, or other suitable materials. The dummy gate(s) 202 is then selectively removed with respect to SiGe fin(s) 202 (e.g., via selective etching), as shown in FIGS. 5 to 5B. This creates a trench 504 that exposes a portion of the underlying fin structure 202 herein referred to as the "channel region 506".

A thin layer of germanium dioxide ($GeO_2$) 602 is then formed over the entire structure 100 as shown in FIGS. 6 to 6B. The layer of germanium dioxide 602 contacts the top surface 604 of the ILD 406, the top surface 606 of the spacers 308, the inner sidewalls 608 of the spacers 308, and the top surface 610 of the exposed portion of channel region 506. FIG. 6B shows the germanium dioxide layer 602 in contact with a top surface and exposed sidewalls of the fins 202, 204, 206 and in contact with a top surface of the isolation regions 208, 210, 212, 214. In one embodiment, the germanium dioxide layer is formed using an ALD process and has a thickness of, for example, 3 nm. However, other thicknesses are applicable as well. The thickness may be in the range between 2 and 10 nm. For the ALD of GeO2, Ge(OEt)4 and O3 are used a precursors and deposition may be performed at 150-300° C.

Figure 8A:
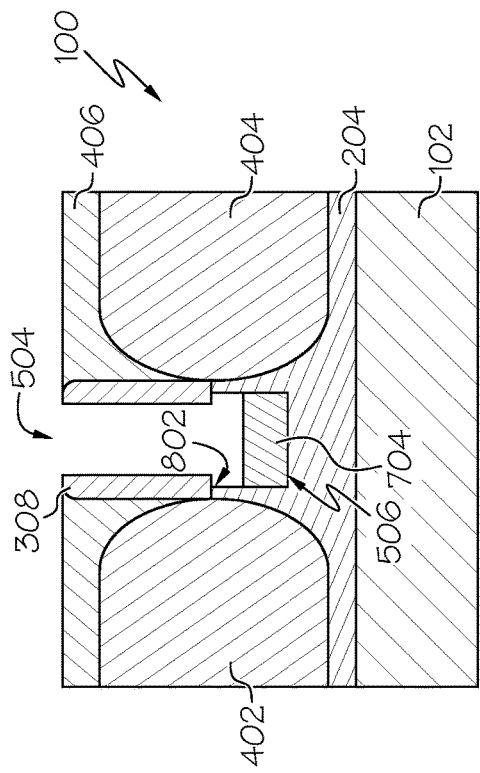
FIGS. 8A and 8B are cross-sectional views of the semiconductor structure after a silicon dioxide layer resulting from the condensation process has been removed according one embodiment of the present invention.
Figure 8B:
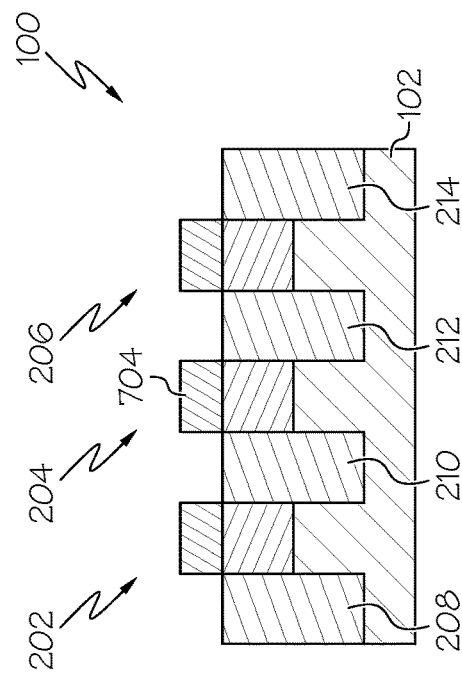
Figure 8:
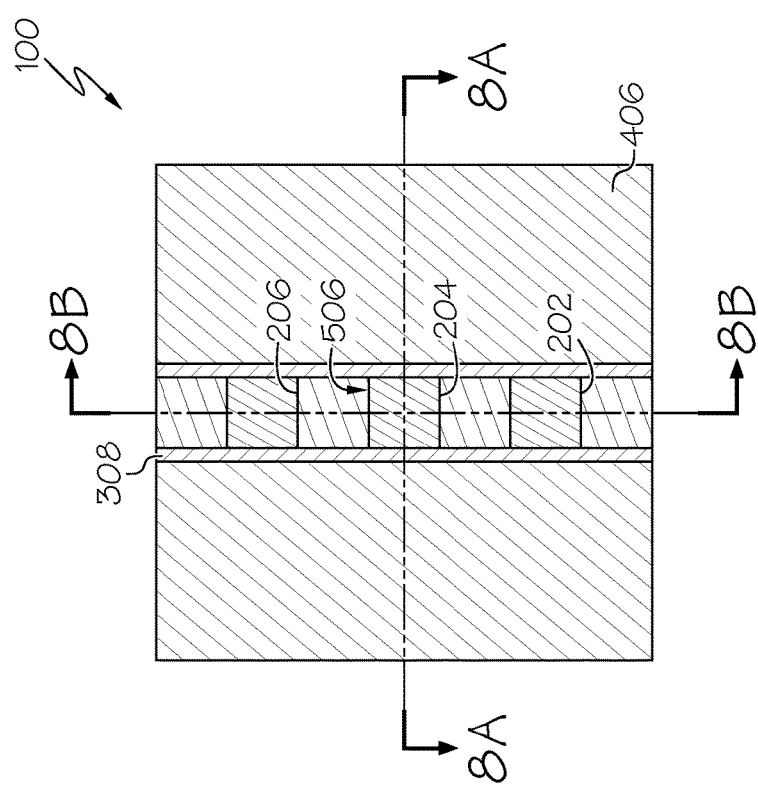
FIG. 8 is a top-down view of the semiconductor structure after a silicon dioxide layer resulting from the condensation process has been removed according one embodiment of the present invention.

A Ge condensation process is then performed to only condense the channel portion 506 of the fin structure(s) 202, as shown in FIGS. 7 to 7B. The condensation process involves performing an anneal under a non-oxidizing ambient, such as N2. One suitable but non-limiting range of temperature is about 500° C. to about 700° C. for a period of some minutes. This low temperature range prevents up-diffusion of the punch through stopper implant species into the channel region 506. In a case where the anneal process involves oxidation, the oxygen reacts with silicon in the $Si_{1-x}Ge_x$ fin structure(s) 202 to form thermal silicon oxide 702. FIG. 7B shows the silicon oxide 702 in contact with a top surface and exposed sidewalls of the fin 202, 204, 206. The Si in the SiGe channel is selectively oxidized due to its lower Gibbs free energy. Meanwhile, Ge is repelled towards the channel region 506 of the $Si_{1-x}Ge_x$ fin structure (s) 20. As a result, the Ge concentration in the channel region 506 of the fin structure(s) 202 fin is increased after oxidation and a high Ge content area 704 within the channel region 506 is formed. Such a Ge enrichment process can be referred to without limitation as "condensation". The silicon oxide 702 is then removed using one or more processes such as etching, as shown in FIGS. 8 to 8B. This process extends the trench 602 below and under a bottom surface 802 of the spacer 308 and exposes sidewalls of a portion the fin structure 202 under the spacer 308.

The processes discussed above with respect to FIGS. 6 to 8 may be repeated until the target Ge percentage is achieved in the channel region 506. The resulting structure 100 comprises fin structures 202, 204, 206 having a channel region 506 with a high Ge content area 704 (e.g., Ge content greater than 40%) where remaining areas of the fin structures 202, 204, 206 have low Ge content (e.g., less than 30%). In one embodiment, the high Ge content area is thick enough to condense the fins structure(s) from both sides and has a thickness/height of, for example, 2 to 8 nm. The structure 100 also comprises an extension area under the spacer 308 with low Ge content (e.g., less than 30%) similar to that of the initial Ge content in the starting channel material. At least a portion of the extension area is above a top surface high Ge content area 704.

A replacement gate stack(s) 902 is then formed on the channel region 506, as shown in FIG. 9. In one embodiment, the replacement gate stack 902 comprises an optional interfacial layer 904, an insulating layer 906, an optional work-function layer 908, and a gate conductor 910. The interfacial layer 904, in one embodiment, extends under the spacer 308. The interfacial layer 904 may include but is not limited to, silicon oxide, silicon nitride, silicon oxynitride that can be formed by chemical oxidation, low temperature oxidation, nitridation, and/or oxynitridation process.

The insulating layer 906 is formed by depositing a thin conformal layer over the structure 100 by, for example, CVD, PECVD, or ALD. Excessive insulating layer material is removed, for example, by polishing such as chemically mechanical polishing (CMP) and/or etching to form a horizontal portion of the insulating layer 906 in contact with the horizontal portion of the interfacial layer 904, and vertical portions in contact with the vertical portions of the interfacial layer 904 and inner sidewalls of the spacer 308. In one embodiment, the insulating layer 906 may be a high-k dielectric layer. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The insulating layer may further include dopants such as lanthanum or aluminum.

The work-function layer 908 is formed by depositing a thin conformal layer over the structure 100 by, for example, CVD, PECVD, or ALD. Excessive interfacial layer material is removed, for example, by polishing such as chemically mechanical polishing (CMP) and/or etching to form a horizontal portion of the work-function layer 908 in contact with the horizontal portion of the insulating layer 906, and vertical portions in contact with the vertical portions of the insulating la 904 layer. The work-function layer 908 includes one or more metals having a function suitable to tune the work function of finFETs. Examples of first metals that can be employed in the work function metal layer include, but are not limited to TiN, TaN, W, Al-containing alloys. The thickness of the work function metal layers can be from 3 nm to 15 nm, although lesser and greater thicknesses may also be employed.

The gate conductor 910 may be formed, for example, by CVD, PECVD, or ALD and polishing away any excess material. The gate conductor 910 fills the space between the vertical portions of the work-function layer 908, and contacts the horizontal and vertical portions of the work-function layer 908. The top surface of the work-function layer 908 is co-planar with the top surface of the insulating layer 906 and the work function metal 908. In one embodiment, the gate conductor 910 includes, for example, tungsten, aluminum, and/or the like. After the replacement gate 902 has been formed, conventional fabrication process may be performed to complete the device.

Figure 10:
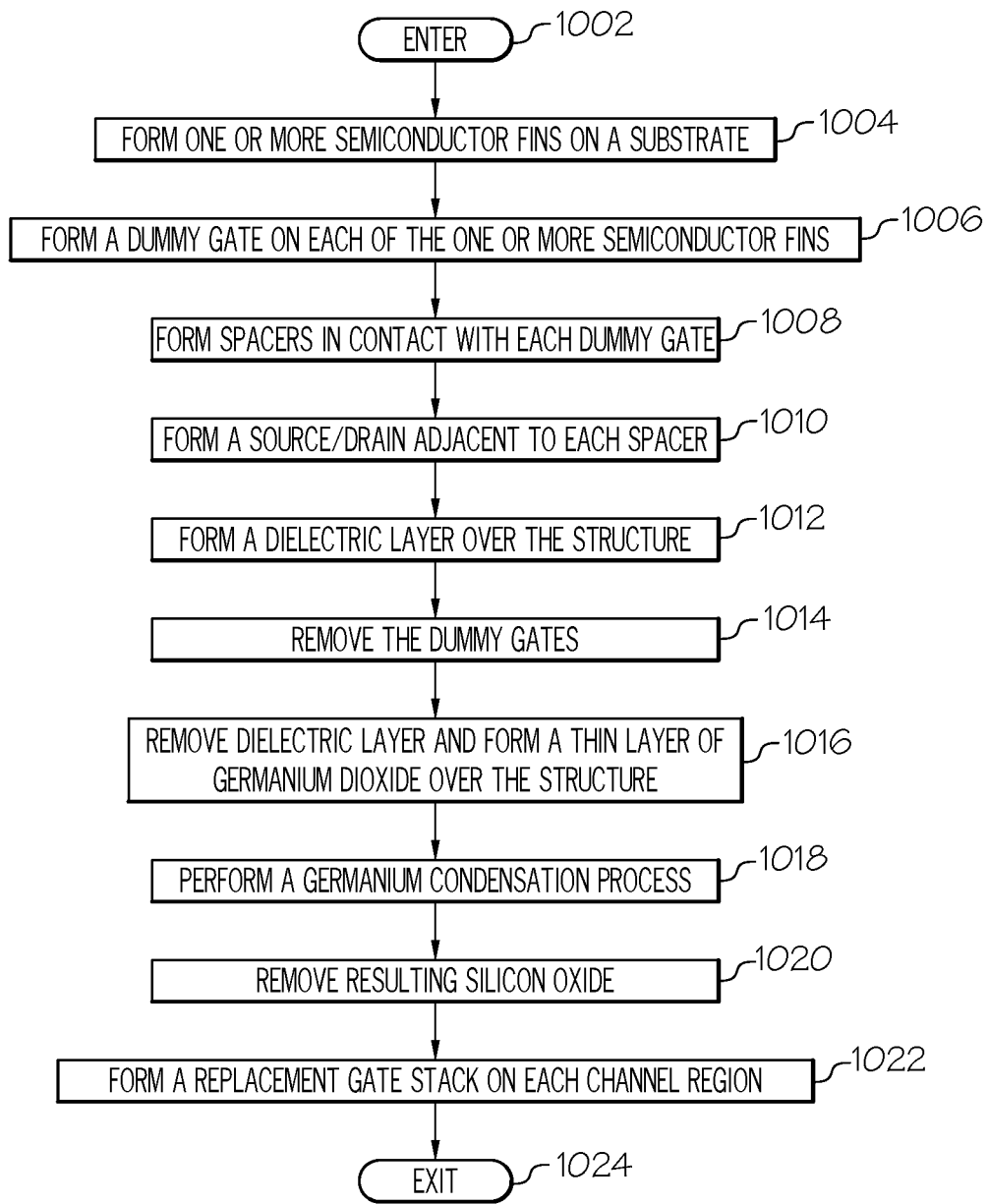
FIG. 10 is an operational flow diagram illustrating one process for fabricating a semiconductor structure according one embodiment of the present invention.

FIG. 10 is an operational flow diagram illustrating one process for fabricating a semiconductor structure. It should be noted that each of the steps shown in FIG. 10 has been discussed in greater detail above with respect to FIGS. 1-9. In FIG. 10, the operational flow diagram begins at step 1002 and flows directly to step 1004. One or more semiconductor fins, at step 1004, are formed on a substrate. A dummy gate, at step 1006, is formed in contact with each of the one or more semiconductor fins.

A spacer, at step 1008, is formed in contact with the dummy gate. Source and drain features, at step 1010, are then formed adjacent to the spacer. A dielectric layer, at step 1012 is formed over the structure. The dummy gate(s), at step 1014, are then removed. This creates a trench within the dielectric layer that exposes a portion of the underlying fin structure (channel region).

The dielectric layer is removed and a thin layer of germanium dioxide ($GeO_2$) is formed over the structure, at step 1016. A Ge condensation process, at step 1018, is performed at temperature ranging from about 500° C. to about 700° C. The condensation process increases germanium content only in the channel region. Resulting silicon oxide, at step 1020, is then removed. It should be noted that steps 1016 to 1020 can be repeated multiple times until the desired percentage of Ge is obtained in the channel region. A replacement gate stack, at step 1022, is then formed on and in contact with the channel region. Typical fabrication devices can then be performed to complete the device. The control flow exits at step 1024.

Although specific embodiments of the invention have been disclosed, those having ordinary skill in the art will understand that changes can be made to the specific embodiments without departing from the spirit and scope of the invention. The scope of the invention is not to be restricted to the specific embodiments, and it is intended that the appended claims cover any and all such applications, modifications, and embodiments within the scope of the present invention.

It should be noted that some features of the present invention can be used in one embodiment thereof without use of other features of the present invention. As such, the foregoing description should be considered as merely illustrative of the principles, teachings, examples, and exemplary embodiments of the present invention, and not a limitation thereof.

Also, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A semiconductor structure comprising:
a substrate;
at least one semiconductor fin;
a channel region within the semiconductor fin, wherein the channel region comprises a higher content of germanium than remaining portions of the semiconductor fin; and
a gate stack in contact with the semiconductor fin and comprising at least a gate insulating layer, wherein the channel region comprising the higher content of germanium extends laterally beyond sidewalls of the gate stack.

2. The semiconductor structure of claim 1, wherein the semiconductor fin comprises silicon germanium, and wherein the channel region comprises a germanium content of at least forty percent, and wherein one or more remaining portions of the semiconductor fin comprise a germanium content of thirty percent or less.

3. The semiconductor structure of claim 1, further comprising:
a spacer surrounding the gate stack.

4. The semiconductor structure of claim 1, wherein the gate stack further comprises at least:
a gate conductor.

5. The semiconductor structure of claim 4, wherein the gate stack further comprises:
an interfacial layer in contact with the channel region and the insulating layer.

6. The semiconductor structure of claim 4, wherein the gate stack further comprises:
a work-function layer in contact with the insulating layer and the gate conductor.

7. The semiconductor structure of claim 1, wherein the substrate comprises a punch through stopper, and wherein the semiconductor fin is free of the punch through stopper.

8. An integrated circuit comprising:
a semiconductor device, wherein the semiconductor device comprises
a substrate,
at least one semiconductor fin,
a channel region within the semiconductor fin, wherein the channel region comprises a higher content of germanium than remaining portions of the semiconductor fin, and
a gate stack in contact with the semiconductor fin and comprising at least a gate insulating layer, wherein the channel region comprising the higher content of germanium extends laterally beyond sidewalls of the gate stack.

9. The integrated circuit of claim 8, wherein the semiconductor fin comprises silicon germanium, and wherein the channel region comprises a germanium content of at least forty percent, and wherein one or more remaining portions of the semiconductor fin comprise a germanium content of thirty percent or less.

10. The integrated circuit of claim 8, wherein the semiconductor device further comprises
a spacer surrounding the gate stack.

11. The integrated circuit of claim 8, wherein the gate stack further comprises at least:
a gate conductor.

12. The integrated circuit of claim 11, wherein the gate stack further comprises:
an interfacial layer in contact with the channel region and the insulating layer.

13. The integrated circuit of claim 11, wherein the gate stack further comprises:
a work-function layer in contact with the insulating layer and the gate conductor.

14. A semiconductor structure comprising:
a substrate;
at least one semiconductor fin;
a channel region within the semiconductor fin, wherein the channel region comprises a higher content of germanium than remaining portions of the semiconductor fin;
a gate stack in contact with the semiconductor fin; and
a spacer surrounding the gate stack, wherein the gate stack extends below the spacer, and wherein the channel region comprising the higher content of germanium extends laterally beyond sidewalls of the gate stack.

15. The semiconductor structure of claim 14, wherein the semiconductor fin comprises silicon germanium, and wherein the channel region comprises a germanium content of at least forty percent, and wherein one or more remaining portions of the semiconductor fin comprise a germanium content of thirty percent or less.

16. The semiconductor structure of claim 14, wherein the gate stack comprises at least:
   an insulating layer; and
   a gate conductor.

17. The semiconductor structure of claim 16, wherein the gate stack further comprises:
   an interfacial layer in contact with the channel region and the insulating layer.

18. The semiconductor structure of claim 17, wherein the interfacial layer is formed below and in contact with a bottom surface of the spacer.

19. The semiconductor structure of claim 16, wherein the gate stack further comprises:
   a work-function layer in contact with the insulating layer and the gate conductor.

20. The semiconductor structure of claim 14, wherein the substrate comprises a punch through stopper, and wherein the semiconductor fin is free of the punch through stopper.

* * * * *